(12) United States Patent
Zheng et al.

(10) Patent No.: US 7,659,519 B1
(45) Date of Patent: Feb. 9, 2010

(54) SYSTEM HAVING REDUCED DISTANCE BETWEEN SCINTILLATOR AND LIGHT SENSOR ARRAY

(75) Inventors: Dawei Zheng, Arcadia, CA (US);
Xavier Clairardin, Naperville, IL (US);
Arlon Martin, Santa Barbara, CA (US)

(73) Assignee: Kotura, Inc., Monterey Park, CA (US)

( * ) Notice: Subject to any disclaimer, the term of this patent is extended or adjusted under 35 U.S.C. 154(b) by 10 days.

(21) Appl. No.: 12/156,784

(22) Filed: Jun. 4, 2008

(51) Int. Cl.
*G01T 1/20* (2006.01)

(52) U.S. Cl. .................................. 250/370.11

(58) Field of Classification Search ............ 250/363.04, 250/370.11
See application file for complete search history.

(56) References Cited

U.S. PATENT DOCUMENTS

| | | | |
|---|---|---|---|
| 5,081,563 A | 1/1992 | Feng et al. | |
| 5,773,829 A * | 6/1998 | Iwanczyk et al. | 250/367 |
| 6,194,726 B1 * | 2/2001 | Pi et al. | 250/363.1 |
| 6,717,150 B2 * | 4/2004 | Hoffman | 250/370.11 |
| 2004/0104350 A1 * | 6/2004 | Tsuchiya et al. | 250/370.08 |
| 2007/0096031 A1 * | 5/2007 | Meier et al. | 250/370.11 |
| 2007/0096177 A1 * | 5/2007 | Okumura et al. | 257/292 |
| 2009/0065704 A1 * | 3/2009 | Heringa et al. | 250/370.11 |

OTHER PUBLICATIONS

Hirafune, Sayaka et al., *Packaging Technology for Imager Using Through-hole Interconnections in Si Substrate*; Proceedings of HDP'04, 2004 IEEE; p. 303-306.

* cited by examiner

*Primary Examiner*—David P Porta
*Assistant Examiner*—Marcus H Taningco
(74) *Attorney, Agent, or Firm*—Gavrilovich, Dodd & Lindsey, LLP

(57) ABSTRACT

A sensor includes a carrier carrying a light sensor array. The light sensor array has pixels that are each configured to generate an electrical output in response to receiving a light photon. The light sensor array can be included in or on a wafer or can be built in or on a wafer. The sensor also includes electrical conductors through which the pixels electrically communicate with electronics on the carrier. Each of the electrical conductors is at least partially positioned in a recess that extends into the wafer.

18 Claims, 8 Drawing Sheets

US 7,659,519 B1

SYSTEM HAVING REDUCED DISTANCE BETWEEN SCINTILLATOR AND LIGHT SENSOR ARRAY

FIELD

The present invention relates to systems that employ optical detectors and more particularly, to systems that employ light sensor arrays.

BACKGROUND

A variety of devices, such as position emission tomography (PET) scanners, make use of sensors that have a scintillator positioned over a light sensor array. During use of these devices, photons are received by the scintillator and are converted to a light photon that is then received at the light sensor array. Electronics in communication with the light sensor array determine which light sensors in the array receive the light photon and use this information to generate the results.

The results generated by the electronics are generally based on the approximation that the light sensor that receives the light photon is positioned where the light photon originated in the scintillator. However, this approximation is often not accurate and accordingly is a source of error in the results. As a result, there is a need for an improvement in the results produced by these devices.

SUMMARY

A sensor includes a carrier carrying a light sensor array. The light sensor array has pixels that are each configured to generate an electrical output in response to receiving a light photon. The light sensor array can be included in or on a wafer or can be built in or on a wafer. The sensor also includes electrical conductors through which the pixels electrically communicate with electronics on the carrier. Each of the electrical conductors is at least partially positioned in a recess that extends into the wafer.

In some instances, each pixels includes a photodiode that is included in the wafer. The wafer can include p-type regions and n-type regions. Each of the photodiodes can include a junction between a p-type region and an n-type region. The p-type regions include p-type dopant, and the n-type regions include n-type dopant. The wafer can also include one or more un-doped regions that each excludes both p-type dopant and n-type dopant.

In some instances, recesses and the portion of each electrical conductor extending from the light sensor array to the carrier are arranged such that the highest point of that portion of each electrical conductor is lower than a highest active region on the light sensor array. The active regions on the light sensor array are the regions of the light sensor array that can receive a light photon and cause one of the pixels to generate the electrical output in response to receipt of the light photon. The height of the wire and the active regions are measured relative to the carrier.

In some instances, the portion of each electrical conductor extending from the light sensor array to the carrier is a wire. The wire can be wire bonded to the carrier and/or the light sensor array.

The recesses can extend part way into the wafer. Alternately, the recesses can extend through the wafer such that each recess is surrounded by the wafer.

BRIEF DESCRIPTION OF THE FIGURES

FIG. 4A is a topview of a portion of the light sensor array and FIG. 4B is a cross section of the light sensor array shown in FIG. 4A taken along a line extending between the brackets labeled B in FIG. 4A.

FIG. 5A is a topview of the light sensor array. FIG. 5B is a cross section of the light sensor array shown in FIG. 5A taken along a line extending between the brackets labeled A in FIG. 5A.

FIG. 6A is a topview of the light sensor array. FIG. 6B is a cross section of the light sensor array shown in FIG. 6A taken along a line extending between the brackets labeled A in FIG. 6A.

FIG. 7A is a topview of the light sensor array 23. FIG. 7B is a cross section of the light sensor array shown in FIG. 7A taken along a line extending between the brackets labeled A in FIG. 7A.

FIG. 8A is a topview of the light sensor array 23. FIG. 8B is a cross section of the light sensor array 23 shown in FIG. 8A taken along a line extending between the brackets labeled A in FIG. 8A.

DESCRIPTION

A sensor has a scintillator positioned over a light sensor array. During operation of the sensor, the scintillator can receive a photon that is converted to a light photon. Electronics in communication with the sensor can generate results using an approximation that the light sensor that receives the light photon is positioned where the light photon originated in the scintillator. The light sensor array is configured such that scintillator can be moved closer to the light sensor array. This arrangement reduces the errors associated with the above approximation and accordingly improves the results provided by the sensor.

Figures 1A, 1B:
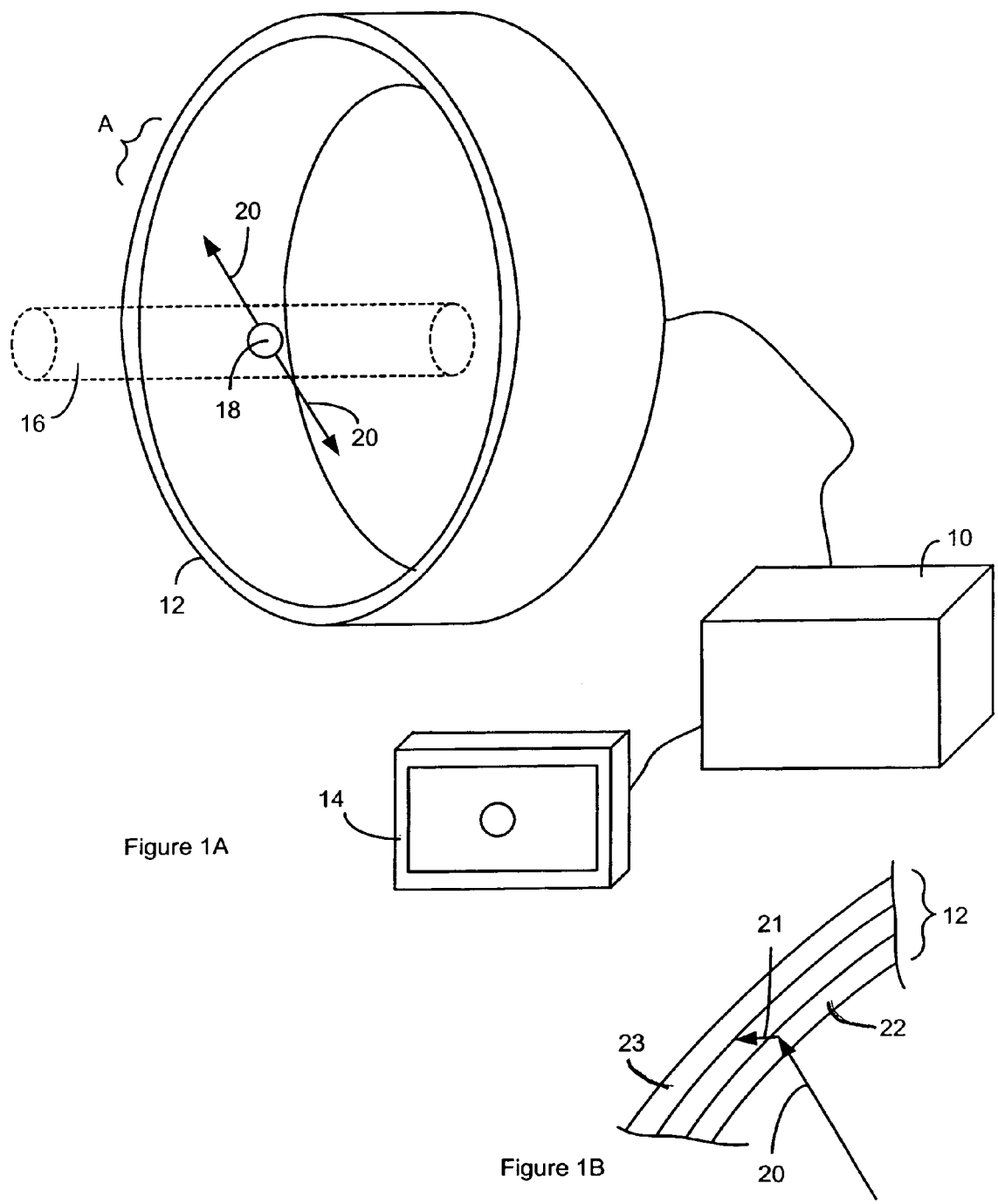
FIG. 1A illustrates a position emission tomography (PET) scanner system. The system includes electronics in communication with a sensor and a display.
FIG. 1B is a cross-section of the sensor in the (PET) scanner system of FIG. 1A. The cross section in FIG. 1B is taken along lines extending through the sensor from the ends of the bracket labeled A in FIG. 1A.

FIG. 1A illustrates a position emission tomography (PET) scanner system. The system includes electronics 10 in communication with a sensor 12 and a display 14. FIG. 1B is a cross-section of the sensor 12 in the (PET) scanner system of FIG. 1A. The cross section in FIG. 1B is taken along lines extending through the sensor from the ends of the bracket labeled A in FIG. 1A. The sensor 12 has a ring shape or other shape that allows the sensor 12 to surround a subject 16 such as a patient.

Before operation of the PET scanner system, a radioactive isotope is delivered into the subject 16 so the isotope accumulates at a site 18 to be imaged by the PET scanner system. The subject 16 is then positioned in the light sensor 12 such that the light sensor 12 surrounds the site 18. The isotope decays such that primary photons (not shown) are generated in the patient. The primary photons are generally positions. After traveling a short distance in the site 18, the primary photon encounters an electron and decays into a pair of secondary photons 20 traveling in opposite directions. The secondary photons 20 are generally gamma photons.

The secondary photons 20 are received by the light sensor 12. As is evident in FIG. 1B, the light sensor includes a scintillator 22 positioned over a light sensor array 23. The secondary photons 20 interact with the scintillator 22 so as to produce a light photon 21 that is received by the light sensor array 23.

Because the light sensor array 23 receives the light photons 21 almost simultaneously, the electronics 10 are able to approximate where each one of the pair of light photons 21 is received on the light sensor array 23. The electronics 10 can use the two locations where the light photons 21 were received on the light sensor array 23 in combination with an approximation that each light photon 21 and the secondary photon 20 that was responsible for that light photon were traveling in the same direction to approximate the origin of the secondary photons 20. Since the secondary photons 20 originate at the site 18 to be imaged, the electronics 10 can repeat this process for many pairs of secondary photons 20 to generate an image of the site 18. The electronics 10 can then display the image on the display 14.

As is evident from FIG. 1B, the light photon and the corresponding secondary photon 20 do not necessarily travel in the same direction. As a result, the approximation that the light photons 21 and the corresponding secondary photons 20 were traveling in the same direction is a source of error. FIG. 1B shows that the light photon travels a distance between being generated and being received at the light sensor array 23. As this distance increases, the errors that result from approximating that the secondary photons 20 and the corresponding light photons 21 as traveling in the same direction increases and the quality of the results decreases. Since the light photons originate in the scintillator 22, these errors can be reduced by decreasing the distance between the scintillator 22 and the light sensor array 23.

Although FIG. 1A and FIG. 1B show the sensor 12 having a scintillator 22 positioned over a light sensor array 23, the following discussion will show that the sensor 12 can include one or more carriers 74 and one or more of the light sensor arrays 23 can be positioned on each of the carriers 74.

Figure 2:
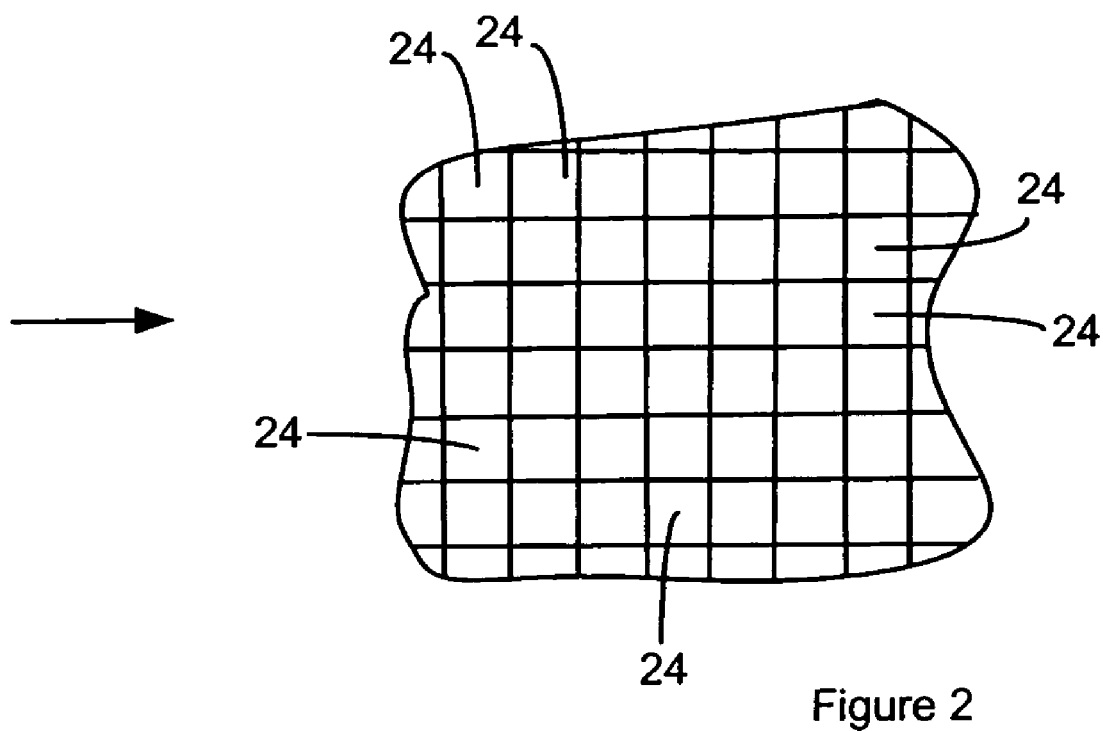
FIG. 2 illustrates a portion of a light sensor array that is suitable for use with a PET scanner system according to FIG. 1. The light sensor array includes a plurality of pixels.

FIG. 2 illustrates a portion of a light sensor array 23 that is suitable for use with a PET scanner system according to FIG. 1. The light sensor array 23 includes a plurality of pixesl 24. The electronics 10 are configured to determine the number of photons that are incident on each of the pixesl 24.

Figure 3:
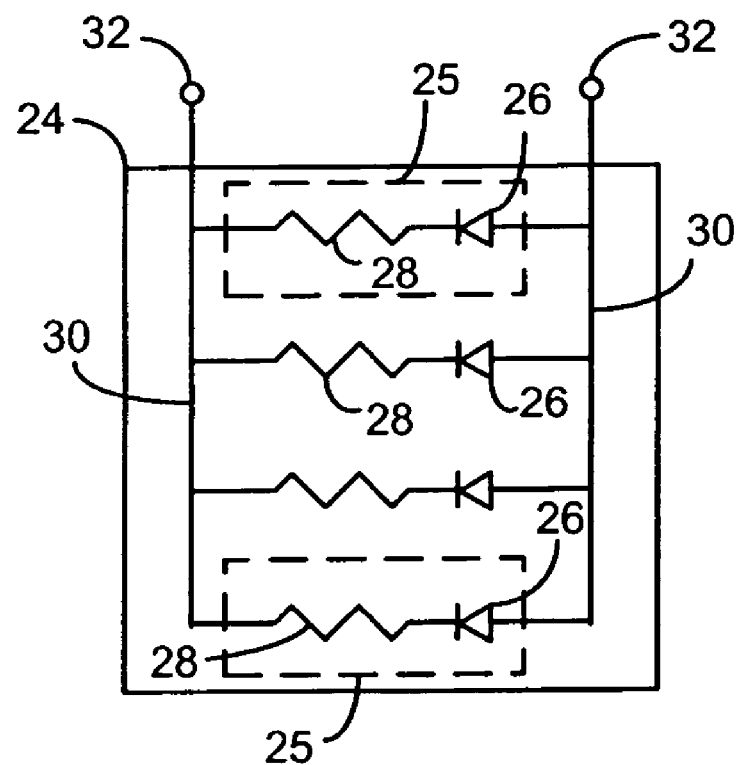
FIG. 3 provides a schematic diagram for detection circuits that are suitable for use in a pixel in a light sensor array according to FIG. 2. Each detection circuit includes a resistor connected in series with an avalanche photodiode.

Each pixel 24 is associated with one or more detection circuits 25. For instance, FIG. 3 provides a schematic diagram for a pixel 24 that is associated with four detection circuits 25. Each detection circuit 25 includes or consists of an avalanche photodiode 26 connected in series with a resistor 28. Each of the avalanche photodiodes 26 can be included in a sub-pixel. For instance, the pixel 24 of FIG. 3 is divided into four sub-pixels. Although FIG. 3 illustrates the sub-pixels are shown arranged in a row, can be arranged in rows and columns and/or in grid or lattice arrangement. For instance, the sub-pixels in a pixel 24 can be arranged as an array of sub-pixels.

Bus lines 30 connect the detection circuits 25 in a pixel 24 in parallel and are in electrical communication with nodes or electrical contacts 32. Electrical energy can be applied to the nodes or electrical contacts 32 to apply a forward bias or a reverse bias to the avalanche photodiodes 26 in the pixel 24 and/or to measure the current between the nodes or electrical contacts 32.

During operation of an avalanche photodiode, a reverse bias can be applied to the photodiode. The reverse bias is applied at a voltage such that receipt of a photon by the avalanche photodiode causes the voltage to drop below a breakdown voltage. As a result, the current of the output signal from the avalanche photodiode increases in response to receipt of the photon. The presence of the resistor in series with the avalanche photodiode limits the current of the output signal to a quenching current. The level of resistance provided by a resistor determines the level of the quenching current. Since the detection circuits are connected in parallel, the current of the output signal from each detection circuit in the pixel 24 is additive. Accordingly, the electronics 10 can employ the level of output signal current to approximate the number of photons received by the pixel 24.

Figure 4A:
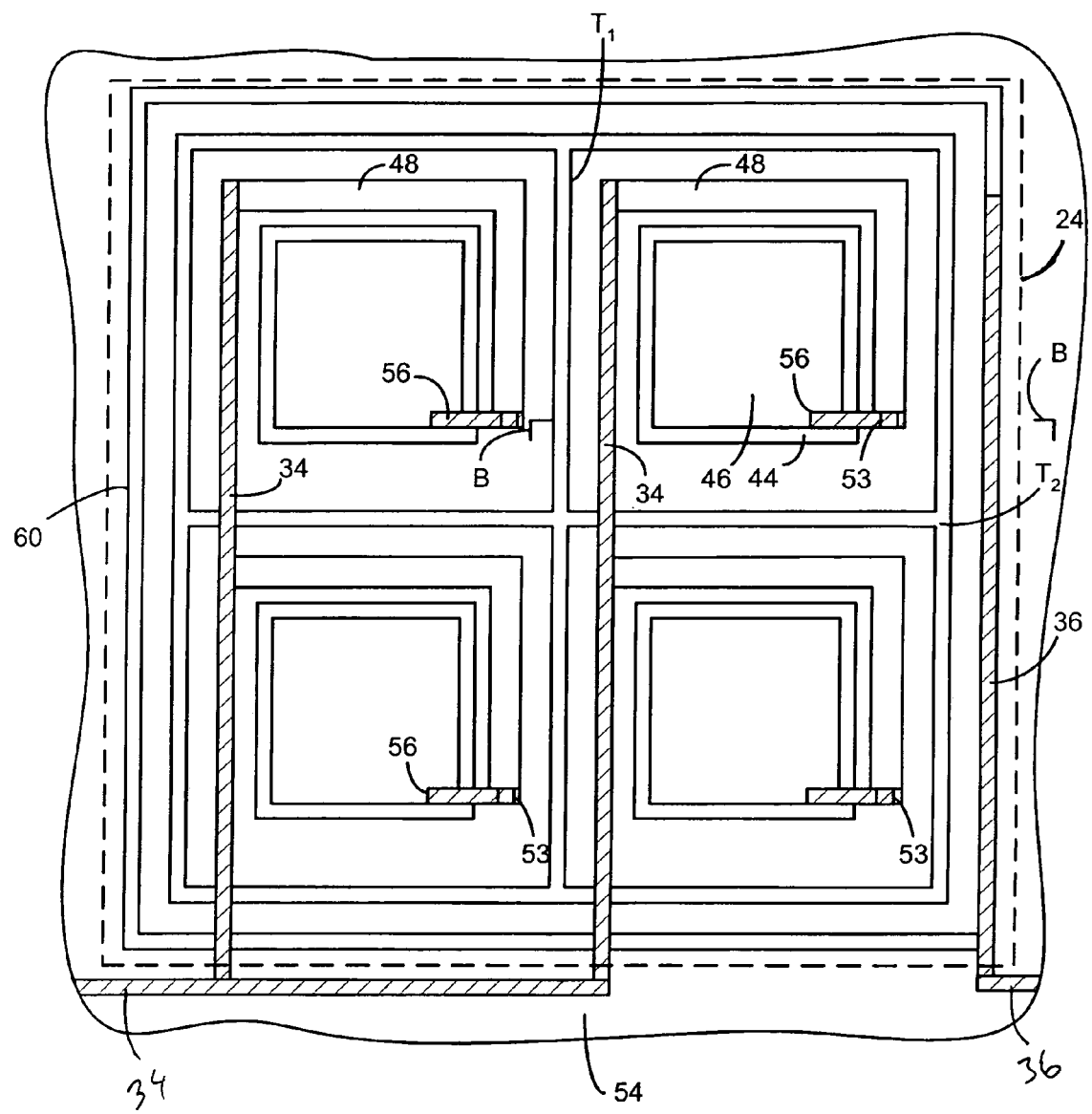
FIG. 4A and FIG. 4B illustrate a suitable construction of a light sensor array suitable for use in a PET scanning system.
Figure 4B:
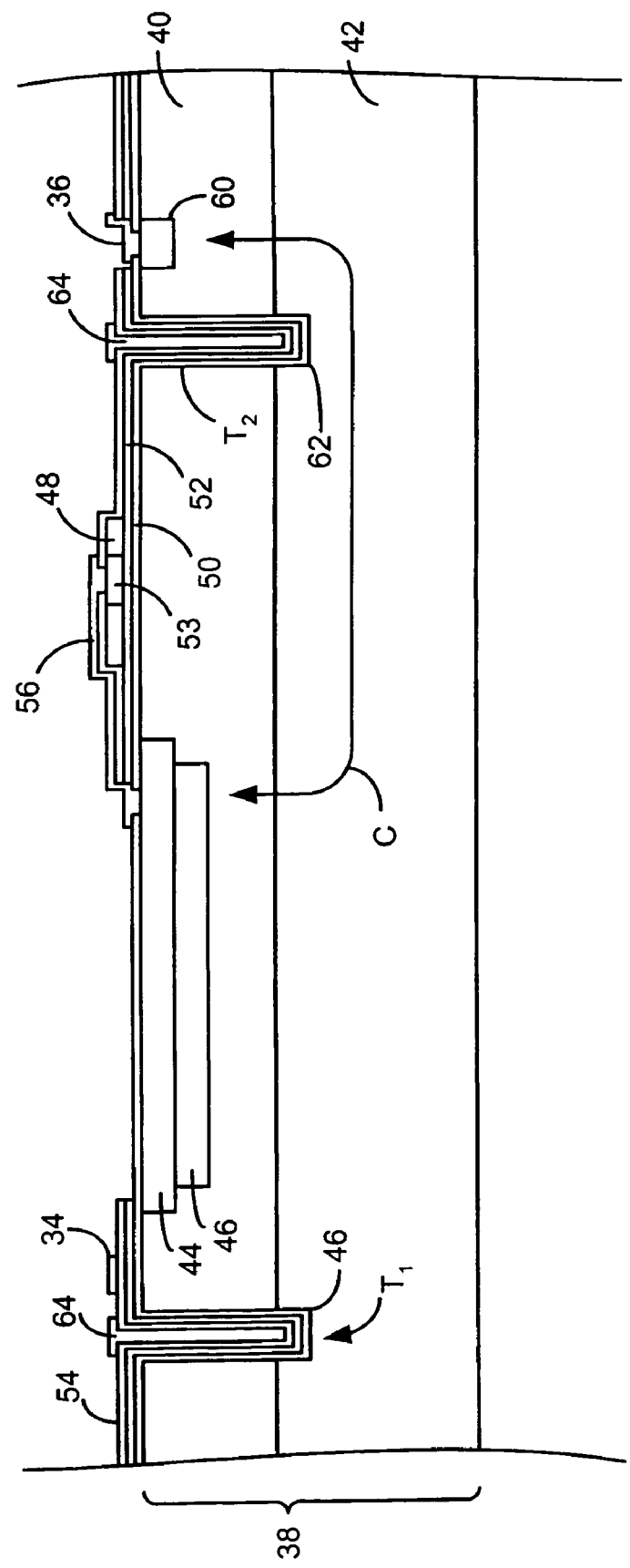

FIG. 4A and FIG. 4B illustrate a suitable construction of a sensor array suitable for use in a PET scanning system. FIG. 4A is a topview of a portion of the light sensor array 23 and FIG. 4B is a cross section of the light sensor array 23 shown in FIG. 4A taken along a line extending between the brackets labeled B in FIG. 4A. The light sensor array 23 includes a plurality of detection circuits. First metal traces 34 and second metal traces 36 on the device can provide electrical communication between different detection circuits in a pixel 24. For instance, the first metal traces 34 and the second metal traces 36 can serve as the bus lines of FIG. 3.

The light sensor array 23 is constructed on a wafer 38. The wafer 38 can have a single layer of material or multiple layers of material. For instance, the illustrated wafer 38 includes an upper region 40 on a substrate 42. In one example, the substrate 42 is silicon and the upper region 40 is a layer of epitaxial silicon grown on the silicon substrate 42. In some instances, the substrate 42 is doped with a p-type dopant to a concentration on the order to $10^{18}$ and the epitaxial silicon is doped with a p-type dopant to a concentration on the order to $10^{15}$.

Each detection circuit includes an upper doped region 44 and a lower doped region 46 formed in the wafer 38. The upper doped region 44 is an n-type region when the lower doped region 46 is a p-type region and the upper doped region 44 is a p-type region when the lower doped region 46 is an n-type region. Additionally, the top of the lower doped region 46 contacts the bottom of the upper doped region 44. As a result, the upper doped region 44 and the lower doped region 46 include a p-n junction and serve as the avalanche photodiode. Suitable dopants for the n-type regions include, but are not limited to, phosphorus and/or arsenic. Suitable dopants for the p-type regions include, but are not limited to, boron.

The regions of the wafer 38 outside of the n-type regions and the p-type regions can optionally be undoped regions that exclude n-type dopants and p-type dopants.

The detection circuits each include a resistor material 48 that serves as a resistor in a detection circuit. A first layer 50 and a second layer 52 are positioned between the resistor material 48 and the wafer 38. The first layer 50 and the second layer 52 are shown in FIG. 4B but are not shown in FIG. 4A. The first layer 50 and/or the second layer 52 can electrically insulate the resistor material 48 from the wafer 38. The first layer 50 and/or the second layer 52 can represent a single layer of material or can represent multiple layers of material. In one example, the first layer 50 represents an oxide layer ($SiO_2$) and a nitride layer (SiN) arranged so the oxide layer is between the nitride layer and the wafer 38, and the second layer 52 represents an oxide layer. A suitable insulation layer includes, but is not limited to, an oxide layer. A suitable material for the resistor material 48 includes, but is not limited to, polysilicon.

A region of the resistor material 48 includes a supplemental doped region 53. The supplemental doped region 53 can include an n-type dopant or a p-type dopant. The added conductivity of the supplemental doped region 53 can serve to increase electrical conductivity of this region of the resistor material 48. In one example, the supplemental doped region 53 is doped with a p-type dopant to a concentration on the order of $5 \times 10^{18}$ cm$^{-3}$.

An optional third layer 54 is positioned on the second layer 52 and also on the resistor material 48. The third layer 54 can serve as a passivation layer and/or to isolate electrical connections to particular area of the resistor material 48. A suitable third layer 54 includes, but is not limited to an oxide layer such as $SiO_2$.

A first electrical connector 56 extends through the third layer 54 into electrical communication with the supplemental doped region 53 of the resistor material 48 and also in electrical communication with the upper doped region 44. Accordingly, the first electrical connector 56 provides electrical communication between the resistor material 48 and the upper doped region 44. As a result, the first electrical connector 56 serves to connect the resistor of a detection circuit to the avalanche photodiode of a detection circuit. The first metal trace 34 provides electrical communication between the resistor material 48 in each of the detection circuits. As a result, the second electrical connector serves as one of the bus line of FIG. 3. In view of the above connections, the first metal trace 34 is in electrical communication with the upper doped region 44 through the resistor material 48 and the first electrical connector 56. Accordingly, electrical energy from the first metal trace 34 flows through the resistor material 48 before flowing to the avalanche photodiode in accordance with the detection circuit illustrated in FIG. 3.

The level of resistance provided by the resistor material 48 can be increased by increasing the distance that electrical energy flows through the resistor material 48. Accordingly, the level of resistance provided by the resistor material 48 can be increased by increasing the distance between the first electrical connector 56 and the first metal trace 34. Alternately, the level of resistance provided by the resistor material 48 can be decreased by decreasing the distance that electrical energy flows through the resistor material 48. Accordingly, the level of resistance provided by the resistor material 48 can be decreased by decreasing the distance between the first electrical connector 56 and the first metal trace 34.

The wafer 38 also includes a common doped region 60 extending into the upper region 40 of the wafer 38. The common doped region 60 can include an n-type dopant or a p-type dopant. In one example, the common doped region 60 includes a p-type dopant. The metal trace extends through the first layer 50, the second layer 52, and the third layer 54 into electrical communication with the common doped region 60. Accordingly, the second metal trace 36 provides electrical communication with the common doped region 60. During operation of the pixel 24, the second metal trace 36 and the common doped region 60 act together to serve as a current collector that collects current through each of the avalanche diodes. Accordingly, each common doped region 60 can surround all or a portion of the avalanche diodes in the pixel 24.

Trenches 62 extend into the wafer 38. A portion of the trenches 62 can serve to increase optical isolation between different avalanche diodes. For instance, the trench 62 labeled $T_1$ in FIG. 4B can reduce cross-talk between the illustrated avalanche diode and the adjacent avalanche diode. Metal 64 can be positioned in the trench 62 to enhance the reduction in cross talk. A portion of the trenches 62 can serve to reduce electrical cross-talk and/or leakage. For instance, the trench 62 labeled $T_2$ in FIG. 4B can reduce leakage between the avalanche diode and the second metal trace 36 or the common doped region 60. As is evident from FIG. 4A, the trenches 62 can be interconnected.

In some instances, the trenches 62 can extend into the wafer 38 below the level of the doped regions. For instance, FIG. 4B shows the bottom of the trenches 62 positioned below the lower doped region 46. Extending the trenches 62 further into the wafer 38 can increase the degree of electrical isolation of the detection circuits. Additionally or alternately, the trenches 62 can extend down to the substrate 42 or through the upper region 40 of the wafer 38 as is evident in FIG. 4B.

During operation of a light sensor array 23 constructed according to FIG. 4A and FIG. 4B, an electrical potential can be applied between the first metal trace 34 and the second metal trace 36. The potential can result in a current that flows through the device along the path illustrated by the arrow labeled C in FIG. 4B.

Although FIG. 4A is illustrated as showing a single pixel 24, the light sensor array 23 of FIG. 4A can be scaled to include more pixels 24.

Figure 5A:
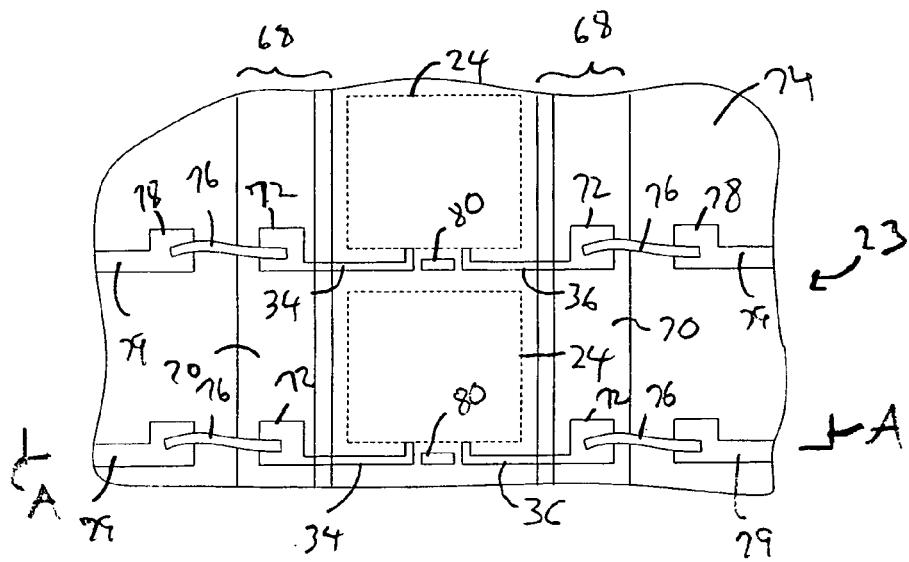
FIG. 5A through FIG. 5B illustrate a construction of a light sensor array.
Figure 5B:
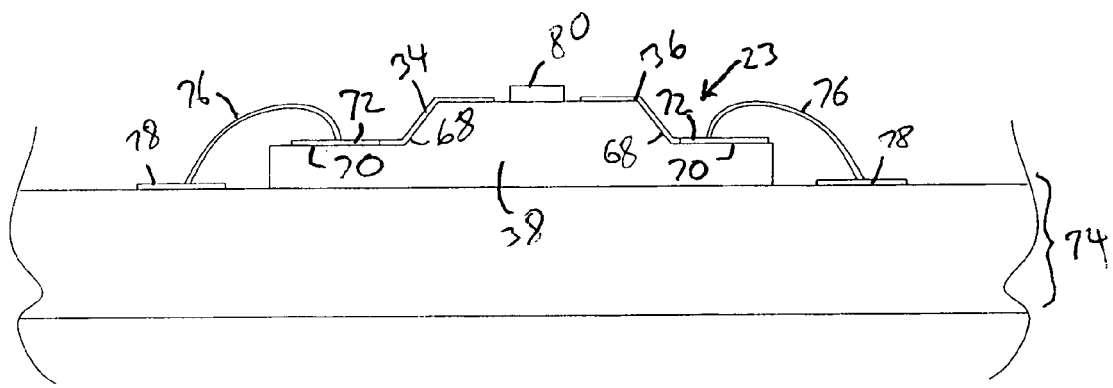
Figure 5C:
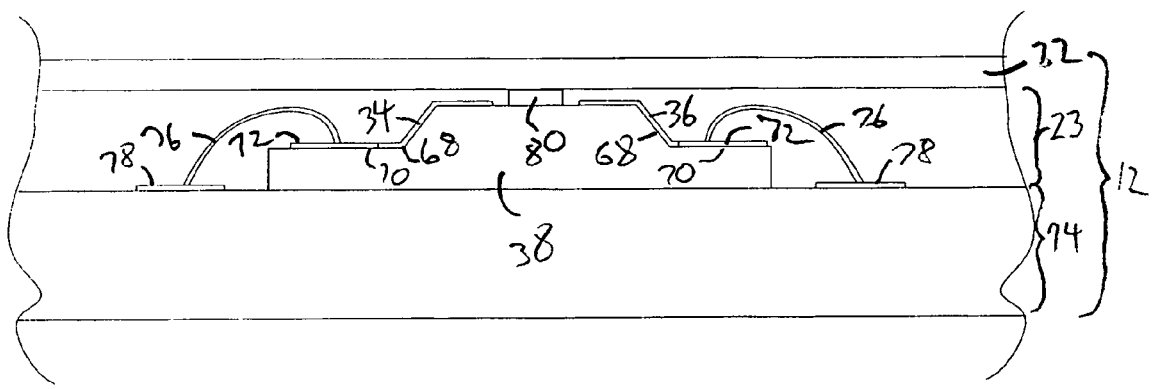
FIG. 5C is a cross section of a sensor having a scintillator and a light sensor array constructed according to FIG. 5A and FIG. 5B.

FIG. 5A through FIG. 5C illustrate a construction of a light sensor array 23 that is suitable for reducing the distance between a scintillator 22 and the light sensor array 23. FIG. 5A is a topview of the light sensor array 23. FIG. 5B is a cross section of the light sensor array 23 shown in FIG. 5A taken along a line extending between the brackets labeled A in FIG. 5A. FIG. 5C is a cross section of a sensor 12 having a scintillator 22 and a light sensor array 23 constructed according to FIG. 5A and FIG. 5B.

For purposes of clarity, the first layer 50, the second layer 52, and the third layer 54 are not shown on the light sensor array 23 of FIG. 5A through FIG. 5C although they may be in place on the light sensor array 23. The details of the pixel 24 construction are not shown in FIG. 5A but the pixels 24 can be constructed according to FIG. 4A and FIG. 4B. Further, the light sensor array 23 of FIG. 4A and FIG. 4B could represent a portion of the light sensor array 23 illustrated in FIG. 5A through FIG. 5C.

Recesses 68 extend part way into the wafer 38 on which the light sensor array 23 is formed. The bottoms of the recesses 68 define a platform 70 below the level of the highest active region on the light sensor array 23. For instance, the active region is the region of the light sensor array 23 that can receive a light photon and cause a pixel 24 to provide an output indicating that the pixel 24 received a light photon. As an example, the top (or upper most surface) of the upper doped region 44 in FIG. 5B represents the highest active region on the light sensor array 23 of FIG. 5B. In this example, when the light sensor array 23 is constructed according to FIG. 4A and FIG. 4B, the uppermost surface of the upper region 40 (or the uppermost surface of the silicon) serves as the highest active region on the light sensor array 23.

The sides of the recesses 68 are shown as being positioned at a non-perpendicular angles relative to the platform 70 but can be positioned at right angles relative to the platform 70.

Each pixel 24 is in communication with a first metal trace 34 and a second metal trace 36. The first metal traces 34 and the second metal traces 36 are each routed down a side of one of the recesses 68 to a contact pad 72 positioned on one of the platforms 70. Each first metal trace 34 and each second metal trace 36 is in electrical communication with one of the pads 72.

The light sensor array 23 is positioned on a carrier 74. Suitable carriers 74 include substrates, printed circuit boards (PCBs), printed wiring boards (PWBs), ceramic composite board, organic substrate board, and Si substrate. Secondary contact pads 78 are positioned on the carrier 74. Conductors 76 provides electrical communication between the pads 72 on the light sensor array 23 and the secondary contact pads 78. Suitable conductors 76 include wires that can be connected to the pads 72 on the light sensor array 23 and/or the secondary contact pads 78 using wire bonding technologies.

The secondary contact pads 78 can be in electrical communication with electronics 79 on the carrier 74. Examples of these electronics include other conductors, circuits, drivers for the pixels, processors, and/or controllers on the carrier 74. The electronics can route electrical signals to or from the secondary contact pads 78. Accordingly, the electronics 79 can be employed to provide reverse biases or forward biases across the pixels 24 on the light sensor array 23.

As is evident in FIG. 5B, the connection of the conductors 76 to a recessed platform 70 lowers the level of these conductors 76 relative to the wafer 38. As a result, this arrangement can allow the scintillator 22 to be moved closer to the light sensor array 23 without the scintillator 22 contacting the light sensor array 23 as shown in FIG. 5C. In a preferred embodiment, the platforms 70 are positioned such that the conductors 76 can be connected to the pads 72 while the conductors 76 remain below the highest active region on the light sensor array 23.

One or more stops 80 can optionally be positioned on the light sensor array 23 and/or between the light sensor array 23 and the scintillator 22 as evident in FIG. 5C. The stop 80 can limit the movement of the scintillator 22 toward the light sensor array 23 and can accordingly prevent the scintillator from damaging the light sensor array. Although the stop 80 is shown positioned outside of the perimeter pixels 24, the stop 80 can be positioned inside the perimeter of a pixel 24 or straddling the perimeter of a pixel 24. Suitable stops 80 include, but are not limited to, crystalline or poly silicon members, PECVD silicon nitride or oxide members, and metal or metal alloy members.

Figure 6A:
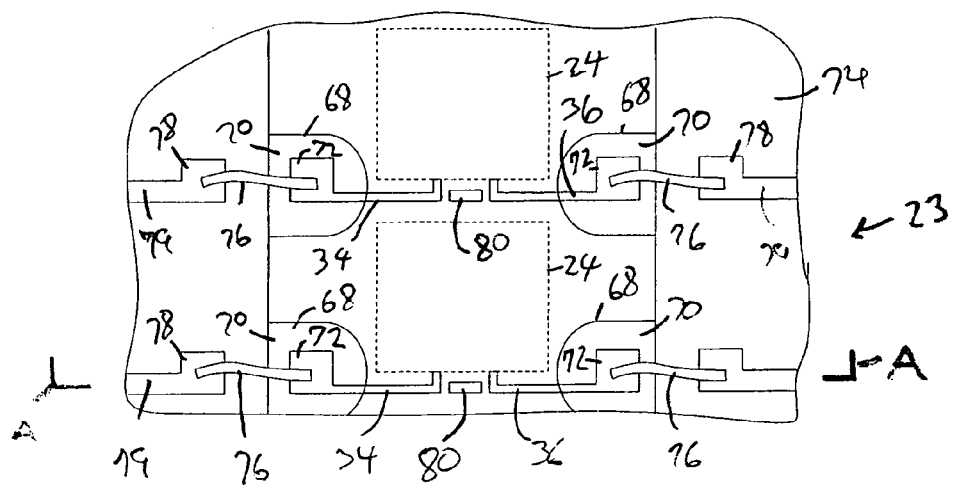
FIG. 6A and FIG. 6B illustrate construction of a light sensor array.
Figure 6B:
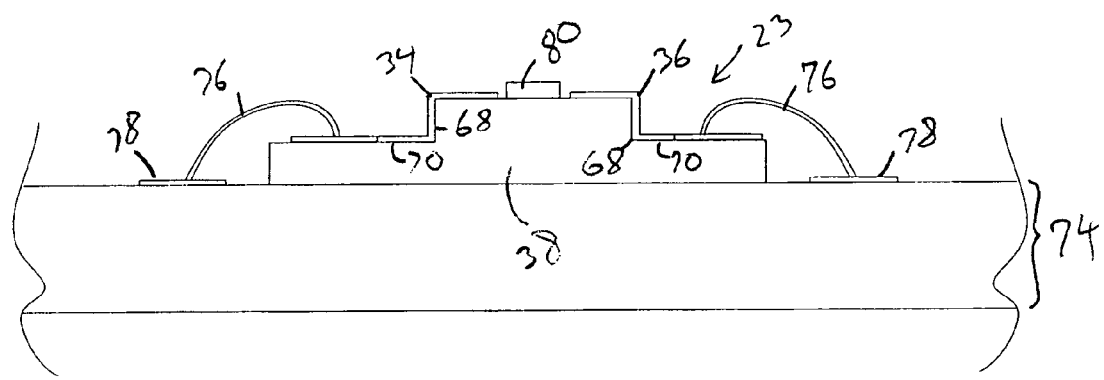

Although FIG. 5A through FIG. 5C show the light sensor array 23 having multiple pads 72 positioned on a platform 70, the lights sensor array can be constructed such that a singled pad 72 is positioned on each platform 70. For instance, FIG. 6A and FIG. 6B illustrate construction of a light sensor array 23 having each pad 72 positioned on a platform 70 in a different recess 68. FIG. 6A is a topview of the light sensor array 23. FIG. 6B is a cross section of the light sensor array 23 shown in FIG. 6A taken along a line extending between the brackets labeled A in FIG. 6A. For purposes of clarity, the first layer 50, the second layer 52, and the third layer 54 are not shown on the light sensor array 23 of FIG. 6A through FIG. 6B although they may be in place on the light sensor array 23.

The first metal trace 34 and the second metal trace 36 are each routed from one of the pixels 24 to a contact pad 72 positioned on one of the platforms 70. Each of the contact pads 72 is positioned on a different one of the platforms 70. The placement of different contact pads 72 in different recesses 68 can increase the area of the wafer 38 that is available for other purposes.

Figure 7A:
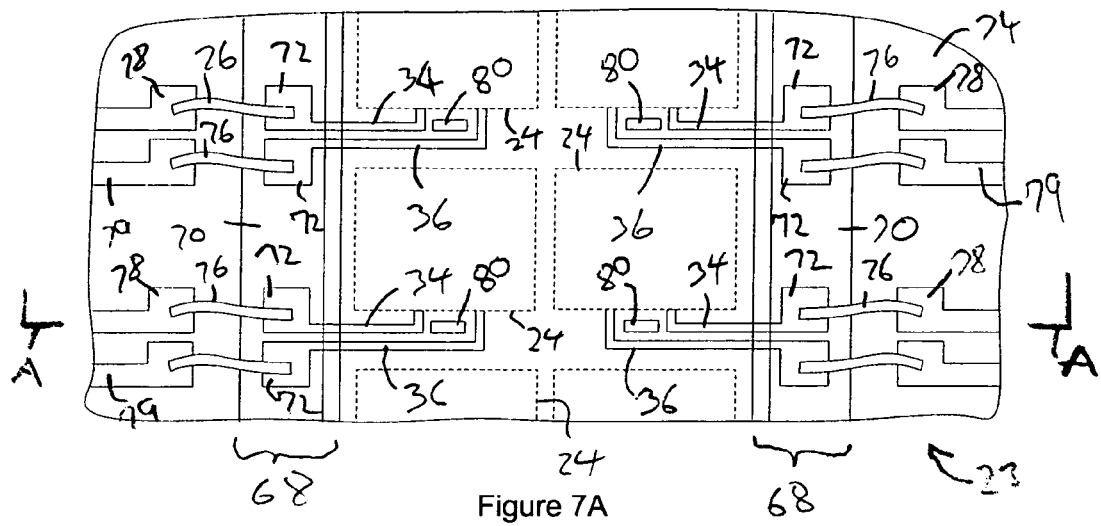
FIG. 7A and FIG. 7B illustrate construction of a light sensor array.
Figure 7B:
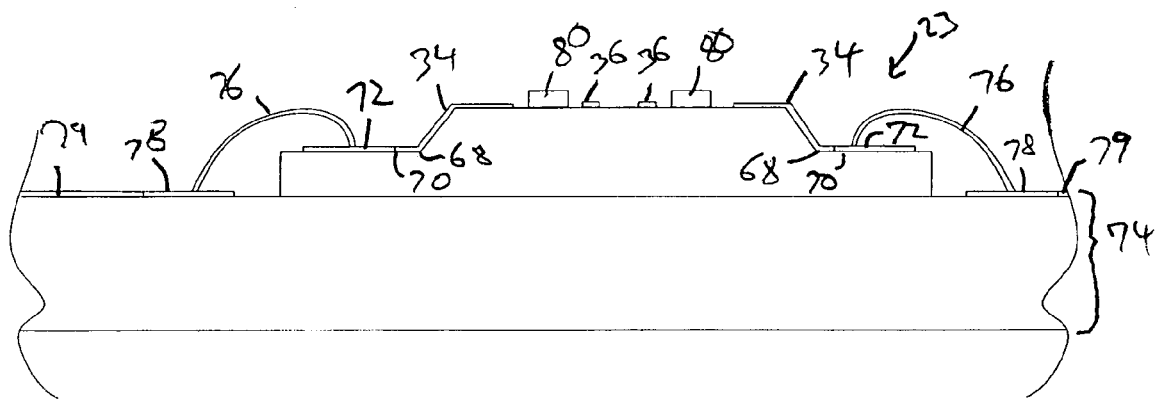

Although the light sensor arrays of FIG. 5A through FIG. 6B are shown having a single column of pixels 24, the light sensor arrays can be scaled to have multiple columns of pixels 24. For instance, FIG. 7A and FIG. 7B illustrate construction of a light sensor array 23 having multiple columns of pixels 24. FIG. 7A is a topview of the light sensor array 23. FIG. 7B is a cross section of the light sensor array 23 shown in FIG. 7A taken along a line extending between the brackets labeled A in FIG. 7A. For purposes of clarity, the first layer 50, the second layer 52, and the third layer 54 are not shown on the light sensor array 23 of FIG. 7A through FIG. 7B although they may be in place on the light sensor array 23. Additionally, the recesses 68 shown in FIGS. 7A through 7B are constructed according to FIGS. 5A through 5C but can be constructed according to FIG. 6A and FIG. 6B.

The light sensor array 23 includes two columns of pixels 24. The pixels 24 are each in electrical communication with a first metal trace 34 and a second metal trace 36. The first metal traces 34 and the second metal traces 36 are each routed into one of the recesses 68 on the light sensor array 23 and are in electrical communication with contact pads 72 on a platform 70 in one of the recesses 68.

Although FIGS. 4A-7B illustrate recesses 68 extending into the wafer 38 on opposing sides of the pixels 24, the light sensor array 23 can include only one recess 68 extending into the wafer 38. The first metal traces 34 and the second metal traces 36 can be routed from each of the pixels 24 onto the platform 70 defined by the recess 68.

Although FIG. 4A through FIG. 7B illustrate the recesses 68 being open to an edge of the light sensor array 23, one or more of the recesses 68 can be centrally positioned on the wafer 38 and be closed to each edge of the light sensor array 23. For instance, one or more of the recesses 68 can extend through the wafer 38 such that each of these recesses is surrounded by the wafer. As an example, the recesses 68 can be vias through the wafer 38 and the first metal traces 34 and the second metal traces 36 can be in electrical communication with the electronics on the carrier 74 through the vias. The use of these vias reduces the complexities associated with routing of the first metal traces 34 and the second metal traces 36 to recesses 68 that are open to an edge of the light sensor array 23. As a result, vias can increase the flexibility of pixel arrangements, pixel density, number of pixels on a light sensor array, and/or number of pixel columns on a light sensor array. As will be evident below, the use of vias also permits the distance between the light sensor array 23 and the carrier 74 to be reduced.

Figure 8A:
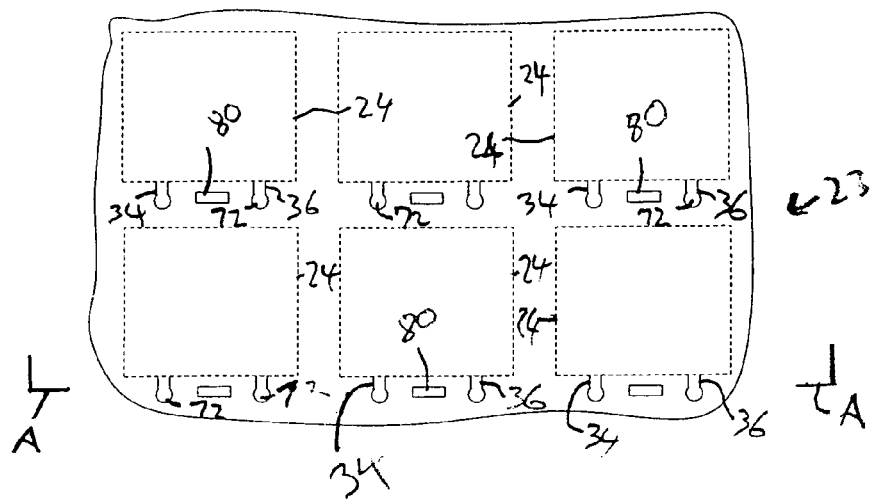
FIG. 8A through FIG. 8B illustrate an example of a light sensor array.
Figure 8B:
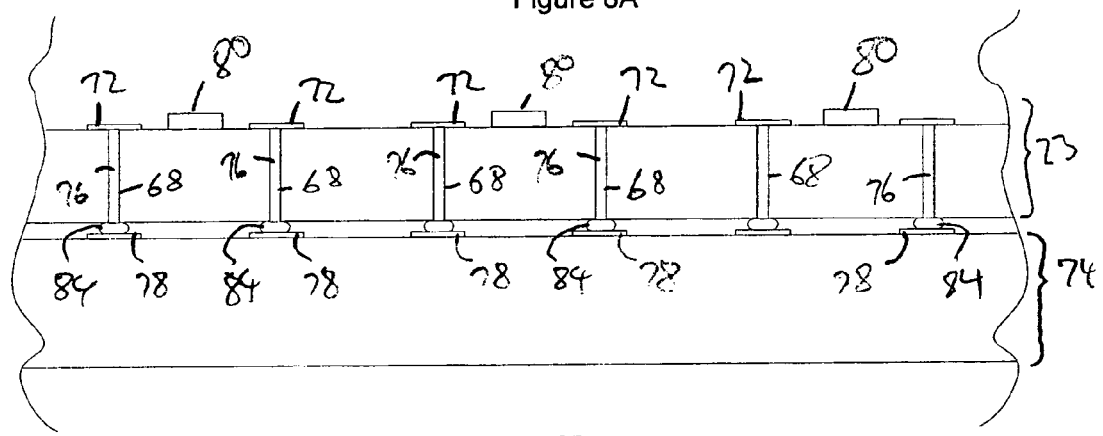
Figure 8C:
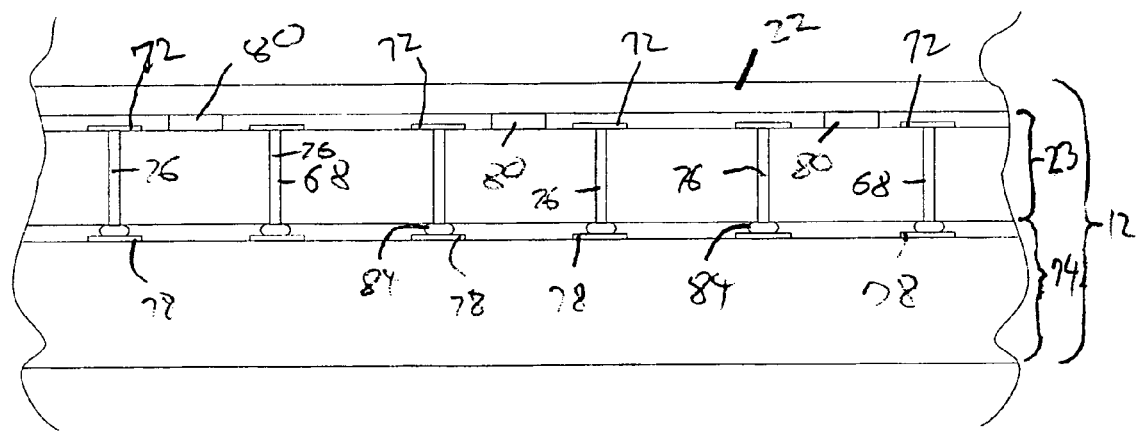
FIG. 8C is a cross section of a sensor having a scintillator and a light sensor array constructed according to FIG. 8A and FIG. 8B.

FIG. 8A and FIG. 8B illustrate an example of a light sensor array 23 where the recesses 68 extend through the wafer 38. FIG. 8A is a topview of the light sensor array 23. FIG. 8B is a cross section of the light sensor array 23 shown in FIG. 8A taken along a line extending between the brackets labeled A in FIG. 8A. For purposes of clarity, the first layer 50, the second layer 52, and the third layer 54 are not shown on the light sensor array 23 of FIG. 8A and FIG. 8B although they may be in place on the light sensor array 23.

The pixels 24 are each in electrical communication with a first metal trace 34 and a second metal trace 36. The first metal traces 34 and the second metal traces 36 each extend to a contact pad 72. The contact pads 72 are each in electrical communication with a conductor 76 positioned in a recess 68 that extends through the wafer 38. The conductors 76 are in electrical communication with secondary conductors 84 positioned between the carrier 74 and the light sensor array 23. The secondary conductors 84 can serve to provide electrical communication between the conductors 76 and the secondary contact pads 78 and/or can serve to immobilize the light sensor array 23 relative to the carrier 74. Suitable secondary conductors 84 include, but are not limited to, solder entities such as solder balls and other entities that include or consist of solder. The conductors 76 and the secondary conductors 84 provide electrical communication between the electronics on the wafer and the first metal traces 34 and/or the second metal traces 36.

Although the conductor 76 is shown as being different from the contact pad 72, the first metal trace 34, and a second metal trace 36, the conductor 76 can be integral with the contact pad 72, the first metal trace 34, and/or a second metal trace 36.

When the light sensor array 23 includes vias, wires and wire bonding techniques are not needed to provide electrical communication between a carrier 74 and the light sensor array 23 as is evident in FIG. 8B. As a result, vias also permit the distance between the light sensor array 23 and the carrier 74 to be reduced.

As noted above, the use of the recesses 68 permits the distance between the scintillator 22 and the light sensor array 23 to be reduced. For instance, the recesses can permit the scintillator to be positioned at a distance of less than 50, 25, 10, or 5 micrometer from the highest active region on the light sensor array 23. In extreme cases, the scintillator could directly touch the light sensor array surface. When one or more stops 80 are used, the stops 80 can have a thickness of greater than 0, 2, or 5 micrometer. Accordingly, the scintillator 22 can be positioned at a distance of less than 50, 25, 10, or 5 micrometer from the highest active region on the light sensor array 23 and a distance of greater than 0 micrometer from the highest active region on the light sensor array 23.

Although FIG. 5A through FIG. 8C illustrate a single light sensor array 23 on a carrier 74, many light sensor arrays can be positioned on a single carrier 74 to form the entire sensor or to form a portion of the sensor. Alternately, a sensor 12 can be formed from a multiple carriers 74 on which are each positioned one or more light sensor arrays 23.

Suitable methods for forming a light sensor array 23 according to FIG. 4A and FIG. 4B are disclosed in U.S. patent application Ser. No. 11/899,402, filed on Sep. 5, 2007, entitled "Detector Having Tuned Resistors," and incorporated herein in its entirety. The recesses 68 disclosed in the context of FIGS. 4A-7B can be etched and the vias of FIG. 8A through FIG. 8C can be formed using the technologies associated with metallized vias and plated vias. The electrical conductors 76 associated with the vias and recesses 68 can be formed using integrated circuit technologies.

Although described as a first metal trace 34 and a second metal trace 36 above, conductors other than metal traces can be employed. For instance, wires can be employed to provide the electrical communication provided by the first metal trace(s) 34 and the second metal trace(s) 36.

The above disclosure includes several references to a wafer. The above wafer can also be a chip. A chip is generally extracted from a wafer. For instance, in general, one or more chips can be taken from a wafer by techniques such as cutting, dicing, etc. The wafer(s) discussed above can be chip(s) or other wafer products.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A sensor, comprising:
a carrier carrying a light sensor array;
the light sensor array having pixels that are each configured to generate an electrical output in response to receiving a light photon;
the pixels each including one or more photodiodes that are each included in a wafer;
electrical conductors through which the pixels electrically communicate with the carrier, each of the electrical conductors being at least partially positioned in one of one or more recesses that each extends part way into the wafer; and
a bottom of each recess defines a platform on the wafer.

2. The sensor of claim 1, further comprising:
a scintillator positioned over the light sensor array such that the light sensor array is between the carrier and the scintillator.

3. The sensor of claim 1, wherein the wafer includes p-type regions and n-type regions,
each photodiode includes a junction between a p-type region and an n-type region,
the p-type regions including p-type dopant, and
the n-type regions including n-type dopant.

4. The sensor of claim 3, wherein the wafer includes un-doped regions, the un-doped regions excluding p-type dopant and n-type dopant.

5. The sensor of claim 3, wherein each pixel includes a resistor connected in series with one of the photodiodes.

6. The sensor of claim 1, wherein the electrical conductors are wires that are each wire bonded to the wafer.

7. The sensor of claim 6, wherein the wires are each wire bonded to the carrier.

8. The sensor of claim 6, wherein the highest point of each wire is lower than a highest active region on the light sensor array, the active regions on the light sensor array being the regions of the light sensor array that can receive a light photon and cause one of the pixels to generate the electrical output in response to receipt of the light photon,
the height of the wire and the active regions being measure relative to the carrier.

9. The sensor of claim 6, wherein electrical contact pads are each positioned on one of the platforms and the wires are each wire bonded to a different one of the contact pads.

10. The sensor of claim 9, wherein the electrical conductors include metal traces on the wafer, the metal traces providing electrical communication between the pixels and the contacts pads.

11. The sensor of claim 9, wherein each recess extends completely through the wafer.

12. The sensor of claim 11, wherein portion of each electrical conductor located in one of the recesses extends completely through the wafer.

13. The sensor of claim 9, wherein solder connections connect the carrier to the light sensor array such that each solder connection contacts the carrier and also contacts one of the conductors that is positioned in one of the recesses.

14. The sensor of claim 9, wherein each recess is surrounded by the wafer.

15. A position emission tomography (PET) scanner system, comprising:
a sensor that includes a carrier carrying a light sensor array, the light sensor array having pixels that are each configured to generate an electrical output in response to receiving a light photon, the pixels each including one or more photodiodes that are each included in a wafer, and electrical conductors through which the pixels electrically communicate with the carrier, each electrical conductor being positioned in a recess that extends part way into the wafer, and a bottom of each recess defines a platform on the wafer; and a scintillator positioned over the light sensor array such that the light sensor array is between the carrier and the scintillator.

16. The scanner of claim 15, wherein the wafer includes p-type regions and n-type regions, each photodiode includes a junction between a p-type region and an n-type region, the p-type regions including p-type dopant, and the n-type regions including n-type dopant.

17. The scanner of claim 15, wherein the electrical conductors are wires that are each wire bonded to the wafer and the highest point of each wire is lower than a highest active region on the light sensor array, the active regions on the light sensor array being the regions of the light sensor array that can receive a light photon and cause one of the pixels to generate the electrical output in response to receipt of the light photon, the height of the wire and the active regions being measure relative to the carrier.

18. The scanner of claim 15, wherein each recess extends completely through the wafer.

* * * * *